United States Patent [19]
Dumoulin et al.

[11] Patent Number: 5,603,320
[45] Date of Patent: Feb. 18, 1997

[54] MAGNETIC RESONANCE (MR) ANGIOGRAPHY USING AN INTEGRATED POLARIZING AND IMAGING MAGNET

[75] Inventors: Charles L. Dumoulin, Ballston Lake, N.Y.; Steven P. Souza, Williamstown, Mass.

[73] Assignee: General Electric Company, Schenectady, N.Y.

[21] Appl. No.: 537,573

[22] Filed: Oct. 2, 1995

[51] Int. Cl.⁶ .................................................. A61B 5/055
[52] U.S. Cl. ................................. 128/653.2; 128/653.3; 128/653.4; 324/309
[58] Field of Search ........................... 128/653.2, 653.3, 128/653.4; 324/307, 309, 306; 335/213, 230, 306

[56] References Cited

U.S. PATENT DOCUMENTS

| | | |
|---|---|---|
| 4,985,678 | 1/1991 | Gangarosa et al. . |
| 5,144,241 | 9/1992 | Oppelt et al. . |
| 5,315,276 | 5/1994 | Huson et al. . |
| 5,479,925 | 1/1996 | Dumoulin et al. . |

FOREIGN PATENT DOCUMENTS 5285124  11/1993  Japan .

*Primary Examiner*—Marvin M. Lateef
*Assistant Examiner*—Shawna J. Shaw
*Attorney, Agent, or Firm*—Lawrence P. Zale; Marvin Snyder

[57] ABSTRACT

A magnetic resonance (MR) active invasive device system for imaging blood vessels employs an integrated polarizing and imaging magnet which is comprised of a small, high-field polarizing magnet whose flux return path is routed through pole structures to produce a large substantially uniform low-field magnetic region suitable for low-field magnetic resonance imaging. A subject is positioned in the uniform low-field region. A catheter is inserted into the patient at or near the root of a vessel tree to be imaged. A fluid, intended to be used as a contrast agent is first passed through the small high-field polarizing magnet, creating a large net longitudinal magnetization in the fluid. The fluid is then introduced into the subject is through the catheter. Radiofrequency (RF) pulses and magnetic field gradients are then applied to the patient as in conventional MR imaging. Since the fluid has a larger longitudinal magnetization before the MR imaging sequence, the fluid produces a much larger MR response signal than other tissue, resulting in the vessel tree being imaged with excellent contrast.

4 Claims, 2 Drawing Sheets

MAGNETIC RESONANCE (MR) ANGIOGRAPHY USING AN INTEGRATED POLARIZING AND IMAGING MAGNET

CROSS REFERENCES TO RELATED APPLICATIONS

This application is related to U.S. Patent applications "MAGNETIC RESONANCE (MR) ANGIOGRAPHY USING A TOROIDAL POLARIZING MAGNET AND A LOW-FIELD IMAGING MAGNET" by C. Dumoulin and R. Darrow (Atty. Docket No. RD-23,707); "APPARATUS AND METHODS FOR MAGNETIC RESONANCE (MR) ANGIOGRAPHY USING HYDROGEN POLARIZED AT LOW TEMPERATURES" by S. Souza and C. Dumoulin (Atty. Docket No. RD-23,709); "APPARATUS AND METHODS FOR MAGNETIC RESONANCE (MR) ANGIOGRAPHY USING FLUIDS POLARIZED AT LOW TEMPERATURES" by C. Dumoulin, S. Souza and R. Darrow(Atty. Docket No. RD-23,710); "APPARATUS AND METHODS FOR MAGNETIC is RESONANCE (MR) IMAGING OF CAVITIES USING FLUIDS POLARIZED AT LOW TEMPERATURES" by S. Souza, C. Dumoulin, R. Darrow and H. Cline (Arty. Docket No. RD-23,714); and "MAGNETIC RESONANCE (MR) PERFUSION IMAGING IN A LOW-FIELD IMAGING MAGNET" by C. Dumoulin and S. Souza (Atty. Docket No. RD-23,778); all assigned to the present assignee, and all incorporated by reference.

BACKGROUND OF THE INVENTION

1. Field of the Invention

The present invention relates to medical imaging of blood vessels, and more particularly concerns the use of magnetic resonance to obtain such imaging.

2. Description of Related Art

Angiography, or the imaging of vascular structures, is very useful in diagnostic and therapeutic medical procedures. MR angiography is performed with a variety of methods, all of which rely on one of two basic phenomena. The first phenomena arises from changes in longitudinal spin magnetization as blood moves from one region of the patient to another. Methods that make use of this phenomenon have become known as "in-flow" or "time-off-light" methods. A commonly used time-of-flight method is three-dimensional time-of-flight angiography. With this method, a region of interest is imaged with a relatively short repetition time, TR, and a relatively strong excitation radio-frequency (RF) pulse. This causes the MR spins within the field-of-view to become saturated and give weak MR response signals. Blood flowing into the field-of-view, however, enters in a fully relaxed state. Consequently, this blood gives a relatively strong MR response signal, until it too becomes saturated.

Because of the nature of blood vessel detection with time-off-flight methods, the stationary tissue surrounding the vessel cannot be completely suppressed. In addition, slowly moving blood, and blood that has been in the imaged volume for too long, becomes saturated and is poorly imaged.

A second type of MR angiography is based on the induction of phase shifts in transverse spin magnetization. These phase shifts are directly proportional to velocity and are induced by flow-encoding magnetic field gradient pulses. Phase-sensitive MR angiography methods exploit these phase shifts to create images in which the pixel intensity is a function of blood velocity. While phase-sensitive MR angiography can easily detect slow flow in complicated vessel geometries, it will also detect any moving tissue within the field-of-view. Consequently, phase-sensitive MR angiograms of anatomy such as the heart may have artifacts arising from the moving muscle and from the moving pools of blood.

In conventional MR imaging, an inhomogeneity of the static magnetic field produced by the main magnet causes distortion in the image. Therefore a main magnet having homogeneity over a large region is desirable.

Also, a stronger static magnetic field created by the main magnet yields a better signal to noise ratio, all other factors being equal. Typically, these main magnets have been constructed of a superconducting material requiring very low temperatures, and all related support apparatus. These magnets can be very expensive.

There is also the problem of shielding a large high-field magnet. Entire shielding rooms have been constructed to reduce the effects of the magnetic field on nearby areas and equipment. Shielding is also a problem for smaller polarizing magnets since the polarizing magnet must be located close to the imaging magnet and the attractive or repulsive force between the two magnets should be minimized.

Currently, there is a need for a system for obtaining high quality angiography of a selected vessel without the problems incurred with unshielded high-field magnets.

SUMMARY OF THE INVENTION

A magnetic resonance imaging magnet is constructed with a small high-field solenoidal superconducting magnet coil. The magnetic flux return path of the superconducting magnet is made to pass through two pole structures. The pole structures create a homogeneous region having a low magnetic field suitable for low field magnetic resonance imaging.

A fluid is passed through the small high-field magnet, where it becomes polarized, before it is injected into a catheter inserted in a vessel of a patient. The geometry of the integrated polarizing and imaging magnet minimizes the fringe fields generated by the magnet, and consequently permits the location of ferromagnetic items relatively close to the imaging system. In order to achieve maximum polarization the fluid is made to reside in the polarizing field longer than several T1 periods. The polarized fluid is then rapidly transferred from the polarizing region and injected into the patient. MR images are created of the polarized fluid with the MR system which comprises radio-frequency and magnetic field gradient coils and a less powerful static field imaging magnet. The overall system requires much less power to function than a conventional high-field imaging system.

OBJECTS OF THE INVENTION

It is an object of the present invention to provide a system for imaging selected blood vessels using magnetic resonance without the need for a homogeneous high-field imaging magnet.

It is another object of the present invention to provide an MR angiography system which uses a polarizing magnet with minimal fringe fields.

BRIEF DESCRIPTION OF THE DRAWINGS

The features of the invention believed to be novel are set forth with particularity in the appended claims. The invention itself, however, both as to organization and method of operation, together with further objects and advantages thereof, may be best understood by reference to the following description taken in conjunction with the accompanying drawing in which:

DETAILED DESCRIPTION OF THE INVENTION

Figure 1:
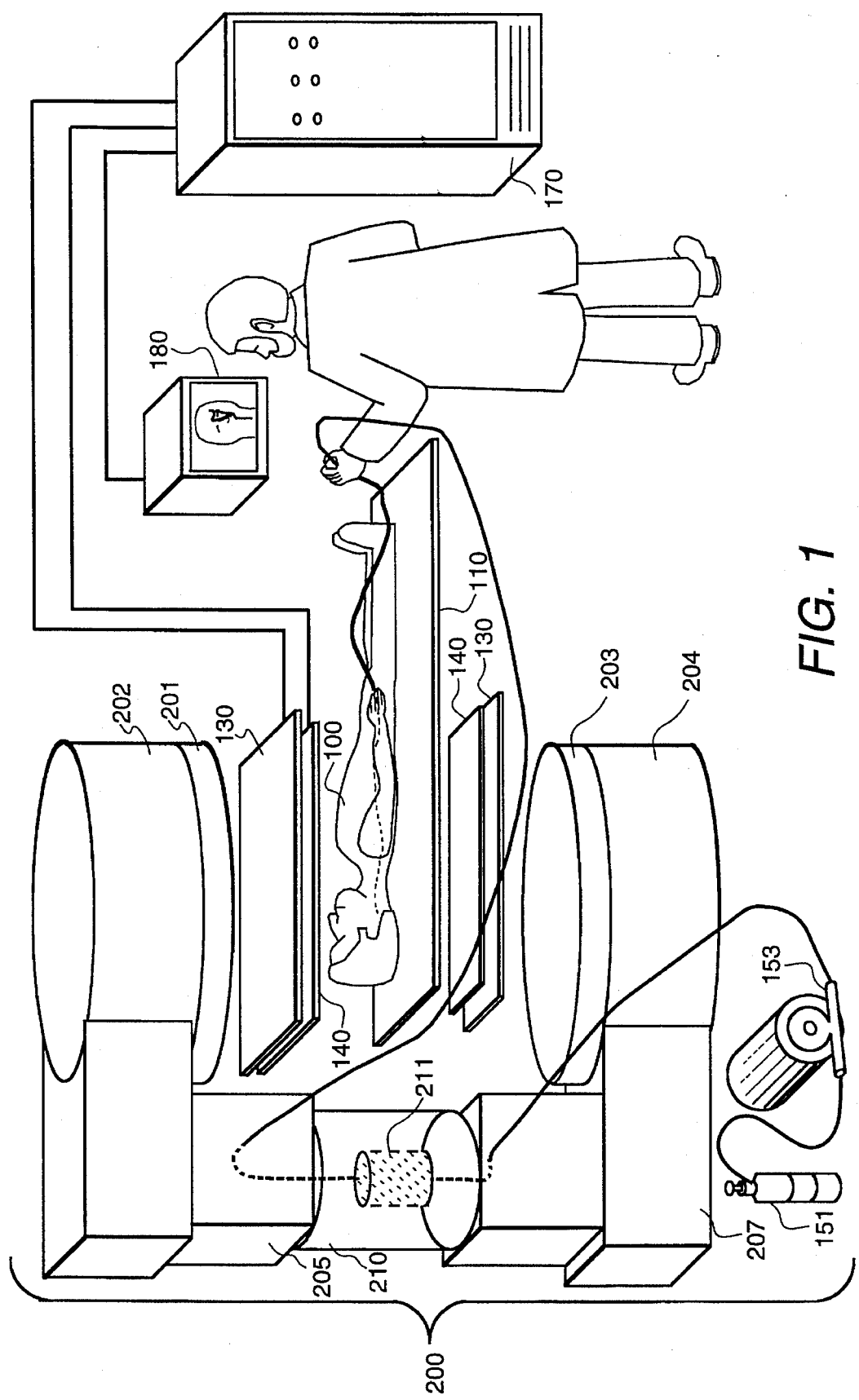
FIG. 1 is a perspective view of a first embodiment of the present invention in operation in which a vessel selective angiogram is being obtained from a subject.

In FIG. 1, a subject 100 is placed on a support table 110 and positioned in a homogeneous magnetic field generated by integrated polarizing and imaging magnet 200. In this embodiment, integrated polarizing and imaging magnet 200 has cylindrical pole faces 201, 203 mounted on cylindrical pole structures 202, 204 which create a substantially uniform magnetic field across subject 100. Subject 100 is positioned such that a region of interest of subject 100 is located between the approximate centers of pole faces 201, 203. Subject 100 is placed within a set of magnetic field gradient coils 130 which create magnetic field gradients of predetermined strength at predetermined times according to predetermined MR pulse sequences, described later. Gradient coils 130 are capable of generating pulsed magnetic field gradients along three mutually orthogonal directions. At least one radio-frequency (RF) coil 140 (only one is shown in FIG. 1) also is near the region of interest of subject 100. In FIG. 1, gradient coils 130 and RF coil 140 have a planar shape. Other geometries, such as smaller cylinders specifically designed for imaging the head or an extremity, can be used in alternative embodiments. Non-symmetric RF coils, may also be used.

RF coil 140 radiates radio-frequency energy into subject 100 at predetermined times and with sufficient power at a predetermined frequency so as to nutate a population of nuclear magnetic spins, hereinafter referred to as 'spins', of subject 100 in a fashion well known to those skilled in the art. RF coil 140 can also act as a receiver, detecting the MR response signals which are stimulated by nutation, if desired.

The nutation of the spins causes them to resonate at the Larmor frequency. The Larmor frequency for each spin is directly proportional to the strength of the magnetic field experienced by the spin. This field strength is the sum of the static magnetic field generated by magnet 125 and the local field generated by magnetic field gradient coil 130.

Fluid in a fluid reservoir 151 is passed through a polarizing chamber 211 located in a polarizing magnet 210 by a pump 153, if required.

Polarizing magnet 210 is a superconducting magnet operating with relatively poor homogeneity if desired, but as high a field as possible. Designs in which the field strength approaches 15 Tesla or more are possible.

The flux return path of polarizing magnet 210 passes through connection structures 205, 207 of the magnet, connecting polarizing magnet 210 to pole structures 202, 204, and pole faces 201, 203, respectively, causing the pole faces to create a relatively uniform magnetic field in the region of subject 100. Since high homogeneity and large volume are not necessary for polarization magnet 210 of the present invention, it should be considerably less expensive than superconducting magnets currently used in existing MR imaging systems.

Once the fluid is polarized in polarizing magnet 210, the polarized fluid is then injected through catheter 150 into subject 100 where it is imaged using conventional MR imaging methods.

The fluid which is injected into the subject 100 through catheter 150 should have the highest amount of polarization possible once it reaches the vessels. Consequently, the polarizing field of polarizing magnet 210 should be high. Also, the fluid will have to be left in the polarizing field for a period of time greater than five times the T1 of the fluid to reach full magnetization. Once the fluid leaves polarizing magnet 210 it will begin to lose polarization with a time constant equal to its T1. Consequently, it is desirable to deliver the fluid to the patient as quickly as possible. This can be done by minimizing the length of the catheter and maximizing the flow velocity.

The fluid in fluid reservoir 151 should have a T1 chosen to be as long as possible to maximize the amount of polarization delivered into the vessels of the patient. Possible choices of fluid are:

1) physiological saline solution;
2) blood previously obtained from the patient;
3) whole blood or plasma from a donor;
4) a blood substitute such as fluorinated hydrocarbons capable of carrying oxygen to tissue; and
5) blood recirculated from the patient.

Figure 2:
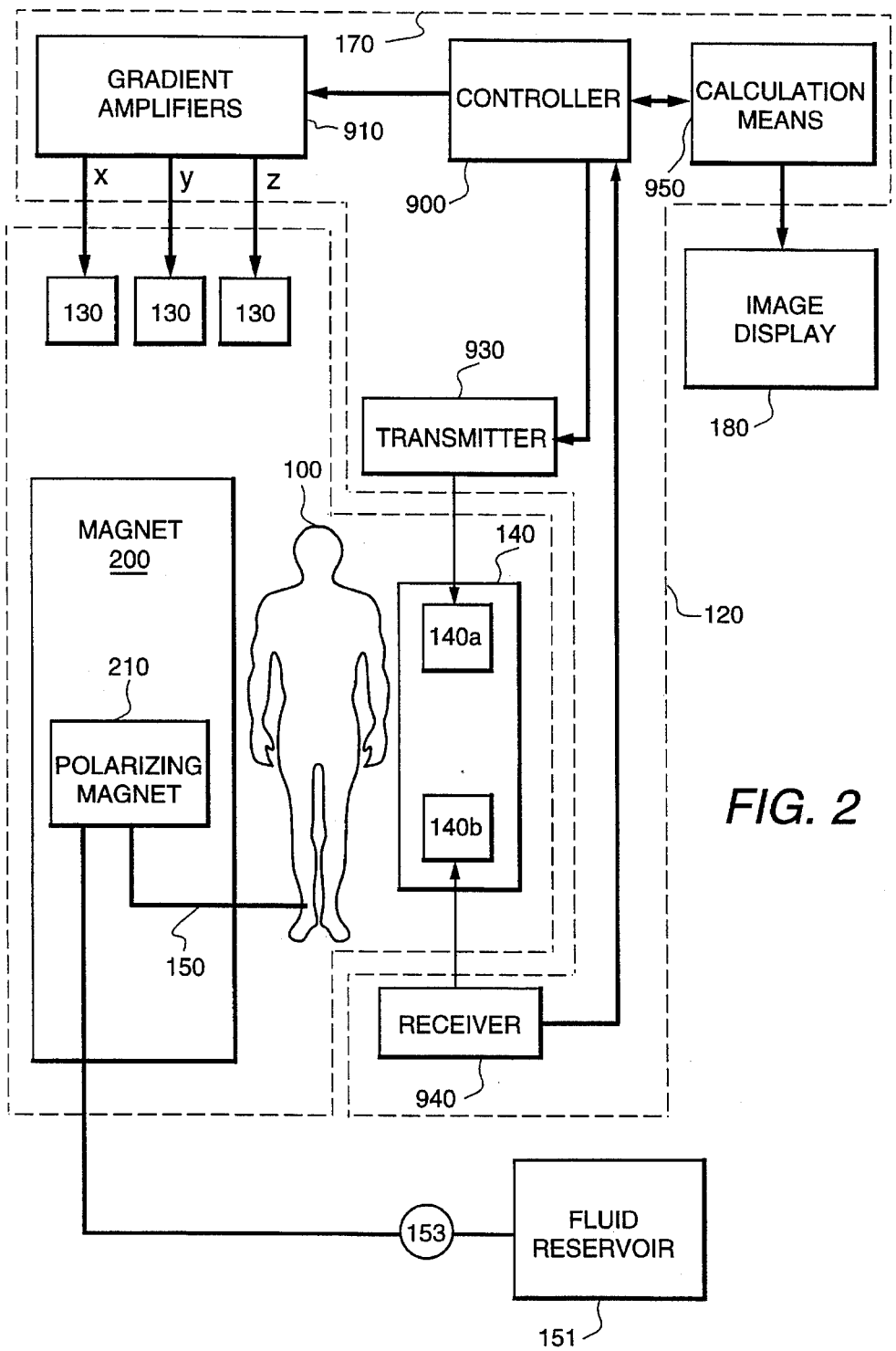
FIG. 2 is a block diagram of a vessel selective MR imaging system suitable for MR angiography according to the present invention.

A schematic representation of the present invention is shown in FIG. 2. The imaging system will have the same elements as a conventional MR imaging system, however, they will function somewhat differently. A static magnetic field between the pole faces 201, 203 of integrated polarizing and imaging magnet 200 could be relatively low (such as 0.1 Tesla) to reduce the contribution of signals from "stationary" tissue and undesired blood pools to the angiographic image. A large low-field imaging magnet would be less expensive than a comparable magnet creating a higher field.

RF transmitter 930 and RF receiver 940 of the MR system shown in FIG. 2 would be modified to be compatible with the lowfield magnet to resonate at a Larmor frequency corresponding to the strength of magnet 125 (e.g., 4.26 MHz in a 0.1 Tesla magnetic field).

RF transmitter 930, and RF coil 140 of the present invention perform the same functions as an RF subsystem of a conventional MR imaging device. Because the Larmor frequency is very low, however, RF coil designs having resonant frequencies comparable to the Larmor frequency will be required. At these lower frequencies, very little RF transmit power will be required, being a further advantage of the present invention. Separate RF transmit 140a and receive 140b coils may be employed instead of a single RF transmit and receive coil 140.

A controller 900 provides control signals to magnetic field gradient amplifiers 910. These amplifiers drive magnetic field gradient coils 130 situated within the magnet enclosure 120. Gradient coils 130 are capable of generating magnetic field gradients in three mutually orthogonal directions.

Controller 900 generates signals which are supplied to RF transmitter 930 to generate RF pulses at one or more predetermined frequencies and with suitable power to nutate selected spins within RF coil 140 situated between the pole faces of integrated polarizing and imaging magnet 200.

MR response signals are sensed by RF coil 140 connected to receiver 940. Since the fluid from fluid reservoir 151 has passed through polarizing magnet 210, it acquires a significantly larger longitudinal magnetization, $M_L$, than material which has only been subjected to the low-field imaging region of integrated polarization and imaging magnet 200. Consequently, when nutated by the RF pulses, 'spins' which have passed through polarizing magnet 210 exhibit larger transverse magnetization, $M_L$, and consequently produce a much larger MR response signal. Receiver 940 processes the MR response signals by amplifying, demodulating, filtering and digitizing. Controller 900 also collects the signals from receiver 940 and propagates them to a calculation means 950 where they are processed. Calculation means 950 applies a Fourier transformation to the signals received from controller 900 to create an MR image. The image created by calculation means 950 is displayed on an image display means 180.

Compared to conventional imaging, the MR response signal of 'spins' which did not pass through polarizing magnet 210 experience a 0.1T magnetic field, 15 times lower than that experienced by a conventional 1.5T MR imaging system. A 10T polarizing magnet 210 produces 6.67 times more polarization than a conventional 1.5T main magnet for the fluid which passes through polarization magnet 210. Therefore, the MR signal ratio, or contrast, between polarized and non-polarized 'spins' would be on the order of 100.

The MR system outlined in FIG. 3 may also be used for the generation of conventional MR images in a manner well known to those skilled in the art. Received MR response signals are detected with either the same RF coil used by the transmitter or a surface coil independent of the coil driven by the transmitter.

While several presently preferred embodiments of the novel MR vascular imaging system have been described in detail herein, many modifications and variations will now become apparent to those skilled in the art. It is, therefore, to be understood that the appended claims are intended to cover all such modifications and variations as fall within the true spirit of the invention.

What is claimed is:

1. A magnetic resonance (MR) imaging system for obtaining vessel-selective MR angiographic images from a subject comprising:

a) a high-field polarizing magnet having a polarizing chamber for receiving and polarizing a contrast fluid and for creating magnetic field flux ;

b) at least two pole structures spaced apart from each other defining a subject receiving region;

c) connection structures each connected to the polarizing magnet and a pole structure for guiding the magnetic field flux of the polarizing magnet through the pole structures of the subject receiving region;

d) a catheter for routing the polarized contrast fluid from the high-field polarizing magnet into said subject;

e) an RF transmitter means for transmitting RF energy into said subject of a selected duration, amplitude and frequency to cause nutation of the contrast fluid and other tissue within said subject;

f) a gradient means for varying the amplitude of the magnetic field in at least one spatial dimension over time;

g) an RF receive coil for detecting a set of MR response signals from the contrast fluid and other tissue within said subject;

h) a receiver means coupled to the RF receive coil for receiving the detected MR response signals;

i) a calculation means for calculating an image from the detected MR response signals;

j) a controller means connected to the RF transmitter means, the receiver means, the calculation means and the gradient means, for activating the RF transmitter means, the receiver means, the calculation means and the gradient means each according to a predetermined MR pulse sequence; and k) a display means connected to the calculation means for displaying the calculated image to an operator.

2. An integrated polarizing magnet and low field magnet for use in magnetic resonance detection system, comprising:

a) a high-field polarizing magnet for encompassing and defining a polarizing chamber adapted for receiving and polarizing an MR active substance, and for creating magnetic field flux;

b) at least two pole structures spaced apart from each other defining a subject receiving region;

c) connection structures each connected between the polarizing magnet and a pole structure for guiding the magnetic field flux of the polarizing magnet through the pole structures and the subject receiving region.

3. A method of obtaining magnetic resonance (MR) angiographic images from a subject comprising:

a) polarizing a contrast fluid by passing it through a high-field polarizing magnet, wherein the high-field polarizing magnet s creates magnetic field flux;

b) routing the magnet field flux through said subject to create a low-field substantially homogeneous magnetic field over said subject;

c) routing the contrast fluid from the polarizing magnet and into a selected vessel of said subject;

d) transmitting RF energy into said subject of a selected duration, amplitude and frequency to cause nutation of the contrast fluid and other tissue within said subject;

e) varying the amplitude of the magnetic field in at least one spatial dimension over time;

f) detecting a set of MR response signals from the contrast fluid and other tissue within said subject;

g) receiving the detected MR response signals;

h) calculating an image from the detected MR response signals; and i) displaying the calculated image to an operator.

4. The method of obtaining magnetic resonance (MR) angiographic images of claim 3 wherein the contrast fluid is passed through the polarizing magnet in the absence of a radiofrequency (RF) excitation pulse.

* * * * *